United States Patent [19]

Cairns et al.

[11] Patent Number: 4,720,419

[45] Date of Patent: Jan. 19, 1988

[54] SUBSTRATES FOR ELECTRONIC DEVICES

[75] Inventors: James A. Cairns, Wantage; James H. Stephen, Abingdon, both of England

[73] Assignee: United Kingdom Atomic Energy Authority, London, England

[21] Appl. No.: 820,898

[22] Filed: Jan. 17, 1986

Related U.S. Application Data

[63] Continuation of Ser. No. 512,744, Jul. 11, 1983, abandoned.

[30] Foreign Application Priority Data

Jul. 14, 1982 [GB] United Kingdom ................ 8220418

[51] Int. Cl.4 ...................... B32B 15/04; B32B 15/18; B32B 15/20
[52] U.S. Cl. ..................................... 428/209; 427/96; 428/469; 428/699; 428/701; 428/702; 428/901
[58] Field of Search ............... 428/469, 433, 699, 701, 428/901, 702, 209, 195; 427/96, 99, 318

[56] References Cited

U.S. PATENT DOCUMENTS

| | | | |
|---|---|---|---|
| 3,698,943 | 10/1972 | Colantuono | 427/318 |
| 3,920,583 | 11/1975 | Pugh | 502/314 |
| 3,992,330 | 11/1976 | Noakes et al. | 502/336 |
| 4,098,722 | 7/1978 | Cairns et al. | 428/183 X |
| 4,143,120 | 3/1979 | Sermon | 423/239 |
| 4,143,205 | 3/1979 | Rowe, Jr. et al. | 428/469 |
| 4,340,635 | 7/1982 | Langman et al. | 428/469 X |
| 4,374,183 | 2/1983 | Deadmore et al. | 428/469 X |
| 4,382,997 | 5/1983 | Henslee et al. | 428/701 X |
| 4,410,598 | 10/1983 | Kuzel et al. | 428/472 X |

Primary Examiner—Thomas J. Herbert
Attorney, Agent, or Firm—William R. Hinds

[57] ABSTRACT

A substrate for use in the manufacture of electronic devices, comprising a lamina made of an aluminum-bearing ferritic steel coated with an adherent layer of a material having a high dielectric strength, a low dielectric constant and a co-efficient of thermal expansion approximately equal to that of the steel lamina.

12 Claims, No Drawings

SUBSTRATES FOR ELECTRONIC DEVICES

This application is a continuation of application Ser. No. 512,744, filed July 11, 1983, now abandoned.

The invention relates to substrates for electronic devices.

It is known to form electronic circuits directly upon the surface of substrates made of ceramic materials which may be coated with very smooth glazes. This high degree of surface smoothness is necessary to prevent the formation of pin holes and other imperfections in the deposited layers which make up the elements of the electronic circuits. Ceramic substrates also are chemically inert. However, such ceramic substrates do have disadvantages. For example, they are brittle and have co-efficients of thermal expansion which differ considerably from those of the materials which are deposited upon them. This thermal mis-match can lead to loss of adhesion between the substrate and the deposited layers if they are used in circumstances which may give rise to excessive temperatures in the substrates. In addition, ceramic substrates have poor thermal conductivity, which limits the power which can be dissipated from the electronic circuits through the substrate to a heat sink.

To alleviate these problems it has been proposed to use substrates made of steels coated with dielectric material. A particular steel which has been suggested for use as a substrate in electrical situations is the aluminium-bearing ferritic steel which is sold under the Registered Trade Mark "FECRALLOY". This steel has the advantage that, due to its aluminium content, it has a naturally occurring surface layer of alumina which can be enhanced by oxidation treatment to provide the dielectric layer. However, such naturally occurring and enhanced oxide layers are not good enough to enable such steels to be used as substrates for electronic circuit devices because:

(a) There is a limit to the thickness of the oxide layer which easily can be grown in practice, thus leading to the existence of small areas exhibiting low voltage breakdown;

(b) The native oxide, at least, is not pure alumina, which can lead to small areas of semiconductive material;

(c) The surface of the native oxide is not smooth enough in that the structure of the surface of the steel is reproduced in the oxide layer; and (d) As with ceramic substrates, the oxide layer often contains an appreciable amount of alpha-particle emitting impurities.

According to the present inventiion, there is provided an electronic device including a substate having electronic circuit elements deposited thereon, the substrate comprising a lamina made of an aluminum bearing ferritic steel coated with an applied adherent layer of a material having a high dielectric strength, a low dielectric constant, and a coefficient of thermal expansion approximately equal to that of the steel lamina, and being of surface smoothness, thickness and purity suitable for adheringly receiving, and compatible with, the electronic circuit elements deposited thereon.

Also according to the invention, there is provided an electronic substrate for receiving a deposited electronic circuit in the manufacture of electronic devices, comprising a lamina made of an aluminum bearing ferritic steel coated with an applied adherent layer of a material having a high dielectric strength, a low dielectric constant, and a coefficient of thermal expansion approximately equal to that of the steel lamina, and being of surface smoothness, thickness and purity suitable for adheringly receiving, and compatible with, electronic circuit material depositable thereon, and having properties appropriate for electronic applications, wherein the layer consists at least primarily of alumina, and wherein the layer also includes MgO.

Also in accordance with the invention, there is provided a substrate for use in the manufacture of electronic devices, comprising a lamina made of an aluminum bearing ferritic steel coated with an adherent layer of a material having a high dielectric strength, a low dielectric constant, and a coefficient of thermal expansion approximately equal to that of the steel lamina, and being of surface smoothness, thickness and purity suitable for adheringly receiving, and compatible with, electronic circuit material depositable thereon, wherein the layer consists at least primarily of alumina and wherein the layer includes magnesium oxide in the approximate proportions of 95% $Al_2O_3$:5% MgO by weight.

By using a separate deposited layer, one is free to vary its composition to optimise its properties, for example to produce a surface of controlled smoothness to optimise the adhesion of subsequently deposited metallic interconnecting layers (e.g. by the well known method of screen printing conductive inks and associated insulating layers) or the elimination of $\alpha$-particles.

Suitable values for the dieletric strength and the dielectric constant are greater than $2 \times 10^6$ volts/cm and 4 to 6, respectively.

A material which satisfies the above criteria is silica with or without the addition of alumina and/or boric oxide.

Alternatively a series of layers of material can be used with graded properties to optimise the thermal matching with the steel at one side of the combined layer, and the chemical and physical properties of the free surface at the other side of the combined layer in order to be compatible with the properties of the applied layers.

The coating may be done by any convenient process such as dipping, spraying, chemical vapour deposition, plasma activated vapour deposition or electrophoresis followed by firing to produce a smooth glazed surface. The coating may be applied to clean unoxidised substrate material, or the substrate material may be subjected to a pretreatment, such as oxidation, prior to the deposition of the coating.

Coatings produced by thermal spraying in particular have been found to possess highly satisfactory dielectric strength for electronic purposes.

'Thermal spraying' includes plasma spraying and flame spraying though the former is preferred in the practice of the invention. These techniques are known and, in respect of the choice of suitable materials to be thermally sprayed in the performance of the invention reference is made to "The preparation and properties of powders for flame and plasma spraying" by R. L. Nelson, J. L. Woodhead, K. T. Scott, L. L. Wassell and A. G. Cross at the VIIth International Metal Spraying Conference (P51), London, September 1973.

Thermal spraying has the advantage of lessening risk of damage or distortion to the lamina because the latter is not subjected to high temperatures during said spraying. If, however, such distortion of a lamina were to occur, e.g. by way of bending, it might subsequently be necessary to heat treat the coated lamina whilst applying pressure thereto in order to remove the distortion. For example, weights might be placed on a coated lamina which might then be heated at 1000° C. for a few minutes.

As indicated above, subsequent firing of a substrate made according to this invention is not precluded. In fact, a subsequent firing step may be necessary in order to deposit certain materials onto the substrate to constitute an electronic circuit thereon. It may, however, be possible to deposit some materials onto the substrate to constitute the circuit without the necessity for firing to be carried out.

The material for thermal spraying may comprise spherical particles having a mean particle size in the range of 2 to 30 μm. Using such material gives rise to a close packed dense coating on the lamina suitable for receiving a deposited circuit and having properties appropriate for electronic applications. The material may, for example comprise a mixture of oxides such as $Al_2O_3$ and MgO or $SiO_2$ and may conveniently be made by spray drying and dispersion of colloidal and non-colloidal particles in a liquid medium. The colloidal particles may, for example, be colloidal böhmite.

The composition, physical form and size of the material for thermal spraying may be varied to optimise the properties of the coating in order to meet specific requirements. For example, it is clearly essential that the coating is compatible with subsequently applied material constituting an electronic circuit.

The coating produced may have a small degree of porosity, for example less than 10% porosity. In order to be compatible with say an ink used to provide an electronic circuit thereon, it may be desirable to enhance the smoothness of the coating. This could be done, for example, by contacting the substrate with a dispersion of particulate material, compatible with the coating, in a liquid medium followed by drying and firing. The particulate material may, for example, be colloidal. In a particular example, a mixture of alumina and silica was applied to a substrate in order to enhance smoothness.

Several ways of carrying out the invention will now be described in detail by way of example only as follows. All proportions given below are by weight.

EXAMPLE 1

A lamina of "FECRALLOY" (Registered Trade Mark) steel was pre-oxidised by heating in air at a temperature of 1200° C. for a period of approximately 10 minutes. It was then immersed in a dispersion of a mixture of $Al_2O_3$, $SiO_2$, $B_2O_3$, $K_2O$, $Na_2O$, and $CaF_2$ in water and the excess liquid allowed to drain. The coated lamina was then fired at 950° C. for a period of 30 minutes, whereupon a smooth, glazed coating approximately 20 μm thick was produced. The proportions by weight of the components of the above mixture were in $SiO_2$ 45%, $Al_2O_3$ 15%, $CaF_2$ 5%; $K_2O$, $Na_2O$ 20%. Obviously the proportions, and indeed the components themselves can be varied to give layers with differing properties.

The dielectric strength of the coating formed above was measured by applying a steadily increasing DC potential difference between a first contact pad on the surface of the coating and a second contact pad on the other side of the lamina. It was found that the above coating was capable of withstanding DC voltages of more than 4 Kv without breaking down.

EXAMPLE 2

A lamina sol was prepared by dispersing 1 kg of a flame hydrolysed alumina powder in 4.5 l of 0.02 M nitric acid. The sol contained 219 g $l^{-1}$ of $Al_2O_3$ equivalent and had a density of 1.14 g/cc. To 0.326 l of the sol was added 0.89 l of an α-alumina powder in slurry form (0.720 kg $Al_2O_3$) followed by 0.290 kg of magnesium oxide with a fine particle size. No adverse effects such as coagulation or significant viscosity changes occurred during the mixing operations and the sol-slurry mixture was diluted to 6.2 l with demineralised water. The feed solution with a $MgO/Al_2O_3$ mole ratio=1.0 had a pH of 11.3, density 1.12 g/cc and contained 146 g $l^{-1}$ of total oxide.

The stirred slurry was fed to a NIRO Mobile Minor spray dryer at 2.8 l $hr^{-1}$ and yielded 0.937 kg of a free-flowing spherical gel powder containing 96% oxide and with a tap density of 0.7 g/cc. Examination by microscope showed the powder was comprised of spherical particles in the size range 5–30 μm with a mean size of 11.2 m. When calcined at 900° C. for 1 hour the spherical particles retained their shape to give an oxide product (0.86 kg) with a tap density of 0.71 g/cc and a composition of 72% $Al_2O_3$ 28% MgO.

The powder was then plasma sprayed onto a FECRALLOY steel lamina using plasma spraying equipment known in the art. The dielectric strength of the coating formed was tested as described in Example 1. Similar results to those of Example 1 were obtained.

EXAMPLE 3

An alumina sol was prepared by dispersing a commercially available alumina monohydrate (boehmite) powder in dilute nitric acid. The sol containing 244 g $l^{-1}$ alumina equivalent was diluted with 3.9 l of demineralised water and then mixed with 0.22 l of a magnesium nitrate solution containing 113 g $l^{-1}$ magnesium oxide equivalent to give a mixture (4.1 l) containing 121 g $l^{-1}$ total oxide nominally 5% MgO 95% $Al_2O_3$.

The dispersion was spray dried at 2.9 l $hr^{-1}$ at an inlet temperature of 220° C. and outlet temperature 100° C. to give a spherical gel powder with particles in the size range 5–30 m and with a tap density of 1.15 g/cc. After calcining at 900° C. the powder had a tap density of 1.10 g/cc and a composition of 95% $Al_2O_3$:5% MgO.

The powder was plasma sprayed onto a lamina and the resulting coating tested as described in Example 1. Similar results to those of Example 1 were obtained.

EXAMPLE 4

An alumina sol (0.975 l) containing 231 g $l^{-1}$ alumina equivalent was mixed with a silica sol (0.025 l) containing 366 g $l^{-1}$ silica equivalent to give a mixture nominally 5% $SiO_2$—95% $Al_2O_3$. The mixed sol (pH 3.8) was stable to coagulation and precipitation and had a viscosity of 25 cp at 23° C. The sol was spray dried (inlet 225° C., outlet 100° C.) to give a spherical gel powder product with particles in the size range 5–30 m and with a tap density of 1.09 g/cc. After calcination the powder had a tap density of 0.8 g/cc and a composition of 95% $Al_2O_3$:5% $SiO_2$.

The powder was plasma sprayed onto a lamina and the resulting coating tested as described in Example 1. Similar results to those of Example 1 were obtained.

EXAMPLE 5

Flame hydrolysed alumina powder (95 g) was added to 1 l of a silica sol containing 5 g of $SiO_2$ equivalent to give a stable mixed sol containing 100 g l−1 total oxide and with the nominal composition, 95% $Al_2O_3$—5% $SiO_2$. This sol was carefully brushed onto a plasma sprayed lamina prepared as described in Example 3 to impregnate the coating and then heat-treated in air at 500° C. The texture and smoothness of the resulting coating were better than those of the original plasma-sprayed coating.

EXAMPLE 6

Aluminium sec-butoxide (88 g) was diluted with 15 ml of xylene and then mixed with 6 g of silicon-aluminium ester to give a nominal composition of 5% $SiO_2$—95% $Al_2O_3$; the solution contained the equivalent of 200 g l−1 of total oxide. The fluid mixture was used to impregnate a plasma-sprayed coatings on a lamina as described in Example 4 above and after heat-treating at 500° C. the resulting coating was significantly smoother than that of the original plasma-sprayed coating.

We claim:

1. An electronic device including a substrate having electronic circuit elements deposited thereon, the substrate comprising a lamina made of an aluminum bearing ferritic steel coated with an applied adherent layer of a material having a high dielectric strength, a low dielectric constant, and a coefficient of thermal expansion approximately equal to that of the steel lamina, and being of surface smoothness, thickness and purity suitable for adheringly receiving, and compatible with, the electronic circuit elements deposited thereon.

2. A device according to claim 1 wherein the dielectric strength of the layer is greater than $2 \times 10^6$ volts/cm.

3. A device according to claim 1 wherein the dielectric constant of the layer is between 4 and 6.

4. A device according to claim 1 wherein said coating is applied directly to a clean unoxidized surface of the steel lamina.

5. A device according to claim 1 wherein the steel lamina is oxidized prior to coating to form an alumina surface layer on which the coating is applied.

6. A device according to claim 1 wherein the layer consists at least primarily of silica.

7. A device according to claim 6 wherein the layer also includes at least one of the materials alumina and boric oxide.

8. A device according to claim 1 wherein the layer consists at least primarily of alumina.

9. A device according to claim 8 wherein the layer also includes silica.

10. A device according to claim 9 wherein the composition of the layer is approximately 95% $Al_2O_3$:5% $SiO_2$ by weight.

11. A substrate for use in the manufacture of electronic devices, comprising a lamina made of an aluminum bearing ferritic steel coated with an adherent layer of a material having a high dielectric strength, a low dielectric constant, and a coefficient of thermal expansion approximately equal to that of the steel lamina, and being of surface smoothness, thickness and purity suitable for adheringly receiving, and compatible with, electronic circuit material depositable thereon, wherein the layer consists at least primarily of alumina and wherein the layer includes magnesium oxide in the approximate proportions of 95% $Al_2O_3$:5% MgO by weight.

12. An electronic substrate for receiving a deposited electronic circuit in the manufacture of electronic devices, comprising a lamina made of an aluminum bearing ferritic steel coated with an applied adherent layer of a material having a high dielectric stength, a low dielectric constant, and a coefficient of thermal expansion approximately equal to that of the steel lamina, and being of surface smoothness, thickness and purity suitable for adheringly receiving, and compatible with, electronic circuit material depositable thereon, and having properties appropriate for electronic applications, wherein the layer consists at least primarily of alumina, and wherein the layer also includes MgO.

* * * * *